(12) United States Patent
Kawaguchi et al.

(10) Patent No.: US 8,541,686 B2
(45) Date of Patent: Sep. 24, 2013

(54) WIRING MEMBER AND METHOD FOR PRODUCING THE SAME

(75) Inventors: Toshiyuki Kawaguchi, Tokyo (JP); Kazutoki Tahara, Saitama (JP); Tsutomu Saga, Saitama (JP); Mitsuaki Negishi, Kitakatsushika-gun (JP)

(73) Assignee: Shin-Etsu Polymer Co., Ltd. (JP)

( * ) Notice: Subject to any disclaimer, the term of this patent is extended or adjusted under 35 U.S.C. 154(b) by 1204 days.

(21) Appl. No.: 12/444,773

(22) Filed: Apr. 8, 2009

(65) Prior Publication Data
US 2013/0168142 A1    Jul. 4, 2013

Related U.S. Application Data

(63) Continuation of application No. PCT/JP2007/069736, filed on Oct. 10, 2007.

(30) Foreign Application Priority Data

Oct. 10, 2006  (JP) ................. 2006-276303
Oct. 10, 2006  (JP) ................. 2006-276304

(51) Int. Cl.
*H05K 1/03*    (2006.01)
*H05K 3/36*    (2006.01)

(52) U.S. Cl.
USPC .......................................... 174/255; 29/830

(58) Field of Classification Search
USPC ................. 174/255–261; 361/780, 792–795; 29/830
See application file for complete search history.

(56) References Cited

U.S. PATENT DOCUMENTS 4,755,911 A  *  7/1988  Suzuki ........................ 361/795
5,519,176 A  *  5/1996  Goodman et al. ............ 174/255

FOREIGN PATENT DOCUMENTS

| JP | 09-293988 A | 11/1997 |
| JP | H11-97810 | 4/1999 |
| JP | 2005-302935 | 10/2005 |
| JP | 2006-49496 | 2/2006 |
| JP | 2006-66810 | 3/2006 |
| JP | 2006-140430 A | 3/2006 |
| JP | 2006-93414 | 4/2006 |
| JP | 2006-140430 A | 6/2006 |
| TW | 200425830 A | 11/2004 |

OTHER PUBLICATIONS

Notice of Allowance dated Aug. 7, 2012 issued in corresponding Japanese Patent Application No. 2008-538734 with English translation.
International Search Report dated Nov. 13, 2007, issued in international application No. PCT/JP2007/069736.
Taiwan Office Action, dated Apr. 19, 2011, issued in corresponding Taiwanese Patent Application No. 096138002 with English translation. Total 8 pages.

* cited by examiner

*Primary Examiner* — Jeremy Norris
(74) *Attorney, Agent, or Firm* — Ostrolenk Faber LLP

(57) ABSTRACT

A wiring member including: a copper foil; a noise suppressing layer containing a metallic material or a conductive ceramic and having a thickness within the range of 5 to 200 nm; an organic polymer film; and an insulating adhesive layer, wherein the insulating adhesive layer is provided between the organic polymer film formed on the noise suppressing layer and the copper foil, or between the noise suppressing layer formed on the organic polymer film and the copper foil. Further, there is provided a method for producing the wiring member.

12 Claims, 5 Drawing Sheets

WIRING MEMBER AND METHOD FOR PRODUCING THE SAME

CROSS REFERENCE TO RELATED APPLICATIONS

The present application is a continuation of PCT/JP2007/069736, filed Oct. 10, 2007, which claims benefit of Japanese Application No. 2006-376303, filed Oct. 10, 2006 and Japanese Application No. 2006-376304, filed Oct. 10, 2006, the disclosures of which are incorporated herein by reference.

TECHNICAL FIELD

The present invention relates to a wiring member which can compose a printed wiring board and a method for producing the same.

BACKGROUND ART

In recent years, along with the arrival of a ubiquitous society, the achievement of high-speed performance, multi-functions, and integrated functions of a micro processing unit (MPU) and the achievement of high-speed performance of recording devices such as memory have been taking place in information processing devices, communication devices, or the like, especially in personal computers, mobile phones, and game equipment.

However, noise radiated from these devices or noise conducting through the conductors inside these devices is becoming a problem since it can cause a malfunction of the devices themselves, other electronic equipment, or parts thereof, and can also adversely affect the human body. This noise includes noise caused by an impedance mismatch of conductors provided in a printed wiring board equipped with MPUs, electronic parts, and the like, a noise caused by crosstalk between conductors, and a noise induced by the resonance between a power supply layer and a ground layer which is caused by simultaneous switching of semiconductor elements of the MPU or the like.

As printed wiring boards in which occurrence of such noises are suppressed, the following printed wiring boards are known:

(1) a printed wiring board in which a metallic film made of metal with a resistivity greater than that of copper foil is formed on both surfaces of a power supply layer and a ground layer, the power supply layer and ground layer being formed by a copper foil (Patent Document 1);

(2) a printed wiring board in which a film containing a conductive substance, the film having an anisotropic conductivity in the vertical direction with respect to the printed wiring board surface, is formed on both surfaces of a power supply layer and a ground layer, the power supply layer and ground layer being formed by copper foils (Patent Document 2); and (3) a printed wiring board having a parallel flat plate structure composed of a power supply layer and a ground layer, in which the power supply layer or the ground layer is formed by integrating a resistive conductor film and a pattern for supplying electric current to electronic parts, and thickness of the resistive conductor film is no more than $1/10$ of that of the pattern for supplying electric current to electronic parts (Patent Document 3).

In the printed wiring board (1), it is considered that a high-frequency eddy current flowing through the surface of the copper foil can be attenuated therein, as a result of which an electric potential of power supply or the like can be stabilized and the radiation of unwanted noises can be suppressed even if semiconductor elements are simultaneously switched. In order to attenuate the high-frequency current (surface current) flowing through the surface of a conductor using a metal film with a thickness of several micro meters, the thickness being approximately equal to the surface depth, a material with a considerably high resistivity is required depending on the frequency of the high-frequency current to be attenuated. However, it is practically impossible to acquire such a material, and as a result, the printed wiring board (1) cannot exhibit sufficient noise suppressing effects.

Also, in the printed wiring board (2), it is considered that the high-frequency eddy current can be attenuated therein in a similar way to the above. However, a step of forming an anisotropically conductive film with a surface roughness of copper foil equal to or greater than the surface depth is complicated. In addition, the printed wiring board (2) also cannot exhibit sufficient noise suppressing effects.

Also, in the printed wiring board (3), it is considered that electromagnetic interference (EMI) can be suppressed therein. However, a step of integrating a resistive conductor film and a pattern for supplying electric current to electronic parts is complicated, since the pattern for supplying electric current to electronic parts needs to be formed on the resistive conductor film by plating, and thus a longer time is required for producing the printed wiring board.

[Patent Document 1] Japanese Unexamined Patent Application, First Publication No. Hei 11-97810

[Patent Document 2] Japanese Unexamined Patent Application, First Publication No. 2006-66810

[Patent Document 3] Japanese Unexamined Patent Application, First Publication No. 2006-49496

DISCLOSURE OF INVENTION

Problems to be Solved by the Invention

Accordingly, an object of the present invention is to provide a wiring member for a printed wiring board, which can stabilize the electric potential of a power supply and suppress radiation of unwanted noise by suppressing resonance between a power supply layer and a ground layer caused by simultaneous switching, and also to provide a production method which is capable of producing the wiring member efficiently.

Means for Solving the Problems

A wiring member according to a first aspect of the present invention is characterized by having: a copper foil; a noise suppressing layer including a metallic material or a conductive ceramic and having a thickness within the range of 5 to 200 nm; an organic polymer film provided between the copper foil and the noise suppressing layer; and an insulating adhesive layer provided between the copper foil and the organic polymer film.

In the wiring member according to the first aspect, it is preferable that the total of the thickness of the organic polymer film and the thickness of the insulating adhesive layer be within the range of 3 to 30 µm.

A wiring member according to a second aspect of the present invention is characterized by having: a copper foil; an organic polymer film; a noise suppressing layer provided between the copper foil and the organic polymer film, the noise suppressing layer including a metallic material or a conductive ceramic and having a thickness within the range of 5 to 200 nm; and an insulating adhesive layer provided between the copper foil and the noise suppressing layer.

In the wiring member according to the second aspect, it is preferable that the thickness of the insulating adhesive layer be within the range of 1 to 25 μm.

It is preferable that the noise suppressing layer have a pattern, in which portions of the noise suppressing layer are removed.

It is also preferable that the thickness of the organic polymer film be within the range of 1 to 20 μm.

A method for producing the wiring member of the present invention is a method for producing the wiring member according to the first aspect and is characterized by having the following steps (a), (b), and (c):

(a) a step of forming a noise suppressing layer by physically depositing a metallic material or a conductive ceramic on an organic polymer film;

(b) a step of adhering a copper foil and the organic polymer film using an insulating adhesive; and (c) a step of removing portions of the noise suppressing layer.

It is preferable that the aforementioned steps be conducted in the order of step (a), step (b), and step (c).

Alternatively, the aforementioned steps are also preferably conducted in the order of step (a), step (c), and step (b), or in the order of step (b), step (a), and step (c).

Also, a method for producing the wiring member of the present invention is a method for producing the wiring member according to the second aspect and is characterized by having the following steps (a), (c), and (b'), and in which these steps are conducted in the order of step (a), step (c), and step (b'):

(a) a step of forming a noise suppressing layer by physically depositing a metallic material or a conductive ceramic on an organic polymer film;

(c) a step of removing portions of the noise suppressing layer; and (b') a step of adhering a copper foil and the noise suppressing layer using an insulating adhesive.

Effects of the Invention

When provided in a printed wiring board, a wiring member of the present invention can stabilize an electric potential of a power supply and suppress radiation of unwanted noise by suppressing resonance between a power supply layer and a ground layer caused by simultaneous switching.

According to the method for producing the wiring member of the present invention, a wiring member can be produced efficiently which can stabilize the electric potential of a power supply and suppress radiation of unwanted noise by suppressing resonance between a power supply layer and a ground layer caused by simultaneous switching.

DESCRIPTION OF THE REFERENCE SYMBOLS

10: wiring member; 11: copper foil; 12: insulating adhesive layer; 13: organic polymer film; 14: noise suppressing layer.

BEST MODE FOR CARRYING OUT THE INVENTION

<A Wiring Member According to a First Aspect>

Figure 1:
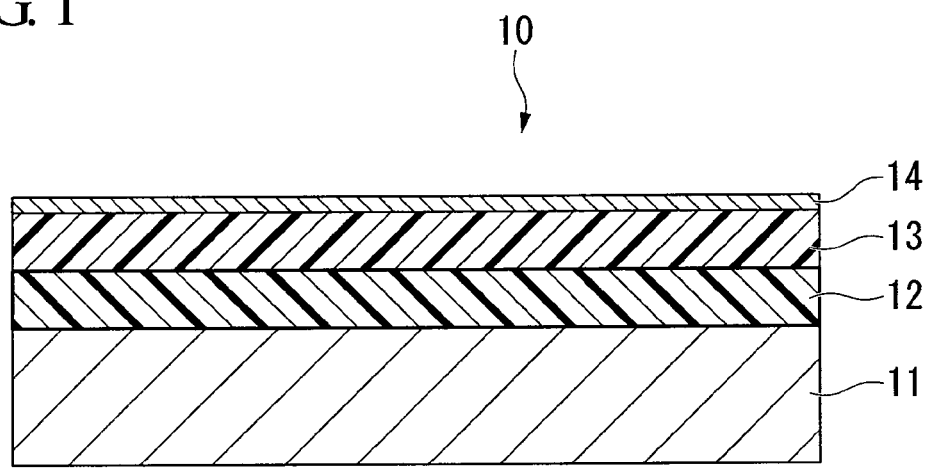
FIG. 1 is a cross sectional view showing a wiring member according to a first aspect of the present invention.

FIG. 1 is a cross sectional view showing a wiring member according to a first aspect of the present invention. The wiring member 10 has a copper foil 11, an insulating adhesive layer 12 formed on the copper foil 11, an organic polymer film 13 formed on the insulating adhesive layer 12, and a noise suppressing layer 14 formed on the surface of the organic polymer film 13.

(Copper Foil)

As the copper foil 11, electrolytic copper foil, rolled copper foil, or the like may be used.

The surface of copper foil is generally treated to be roughened by, for example, adhering fine copper particles to the surface thereof for improving adherence to the insulating adhesive layer 12. It is preferable that the copper foil 11 have a surface with a surface roughness Rz within the range of 0.5 to 8 μm, more preferably within the range of 1 to 5 μm. When the copper foil 11 has a surface with a surface roughness Rz of 8 μm or less, the occurrence of defects in the insulating adhesive layer 12 such as pinholes caused by the surface unevenness of the copper foil 11 becomes unlikely, even if the insulating adhesive layer 12 is thinly formed. The surface roughness Rz used herein refers to a ten point average roughness Rz determined in accordance with JIS B 0601-1994.

As the copper foil 11, electrolytic copper foil is particularly preferable. The electrolytic copper foil is obtained by precipitating copper on the surface of a cathode rotating drum using an electrolytic reaction, followed by separating the formed copper film from the rotating drum. One surface of the obtained film contacting the drum is a smooth surface in which the surface condition of the drum is transferred. On the other hand, the other surface on which the copper is electrolytically precipitated is a rough surface because the crystal growth rates of the copper precipitating in each crystal face are different from each other. Such a rough surface is favorable for adhering it to another insulating resin layer (which is not illustrated).

It is preferable that the thickness of the copper foil 11 be within the range of 3 to 50 μm.

In order to improve handling properties when producing the wiring member 10, the copper foil 11 may have a protective layer or a reinforcing layer which is formed of another copper foil, another organic polymer film, or the like and which is separable, on the surface where the insulating adhesive layer 12 is not formed.

(Insulating Adhesive Layer)

The insulating adhesive layer 12 is a layer formed of an insulating adhesive.

As the insulating adhesive, one having a thermal and moisture resistance for enduring heat at a time of producing a printed wiring board, the thermal and moisture resistance being required for the printed wiring board, or one of which characteristic values required for designing a printed wiring board, such as a dielectric constant, a dielectric loss tangent, or the like, are known, is preferably used. Examples of the insulating adhesive include polyimide resin, epoxy resin, bismaleimide-triazine resin, polytetrafluoroethylene, and polyphenylene ether.

As the insulating adhesive, an epoxy resin is generally used. The epoxy resin may contain, as needed, a hardener, a hardening accelerator, a flexibility imparting agent, or the like.

Examples of the epoxy resin include bisphenol A type epoxy resin, bisphenol F type epoxy resin, bisphenol S type epoxy resin, novolak type epoxy resin, cresol novolak type epoxy resin, alicyclic epoxy resin, brominated epoxy resin, and glycidylamine type epoxy resin. The content of the epoxy resin is preferably within the range of 20 to 80% by mass with respect to 100% by mass of the insulating adhesive.

Examples of the hardener include dicyandiamides; imidazoles; amines such as aromatic amines; phenols such as bisphenol A and brominated bisphenol A; novolak resins such as phenol novolak resins and cresol novolak resins; and acid anhydrides such as phthalic anhydride.

Examples of the hardening accelerator include tertiary amines, imidazole-based hardening accelerators, and urea-based hardening accelerators.

Examples of the flexibility imparting agent include polyether sulfone resins, aromatic polyamide resins, and elastomeric resins.

Examples of the aromatic polyamide resins include ones synthesized by polycondensation of aromatic diamine and dicarboxylic acid. Examples of the aromatic diamine include 4,4'-diaminodiphenylmethane, 3,3'-diaminodiphenylsulphone, m-xylenediamine, and 3,3'-oxydianiline. Examples of the dicarboxylic acid include phthalic acid, isophthalic acid, terephthalic acid, and fumaric acid.

Examples of the elastomeric resin include natural rubber, styrene-butadiene rubber, butadiene rubber, butyl rubber, and ethylene-propylene rubber. In order to ensure the thermal resistance of the insulating adhesive layer 12, nitrile rubber, chloroprene rubber, silicone rubber, or urethane rubber may be used in combination. As the nitrile rubber, carboxy-terminated butadiene nitrile rubber (CTBN) is preferable.

The thickness of the insulating adhesive layer 12 is determined, by taking the balance with the thickness of the organic polymer film 13 into consideration, within the range so as to achieve the total of the thickness of the organic polymer film 13 and the thickness of the insulating adhesive layer 12 of 3 to 30 pin. When the insulating adhesive layer 12 is too thin, the resulting adhesive strength will be weakened. When the insulating adhesive layer 12 is too thick, defects such as microvoids and microcracks easily occur after the drying process. Such defects are extremely small and it is highly difficult to identify an area with these defects. In addition, when the insulating adhesive layer 12 is too thick, the wiring member 10 is easily curled, and thus it is necessary to adjust the flexibility of the insulating adhesive layer 12. Caution is required since the enhancement of flexibility may easily result in the reduction of the surface hardness of the insulating adhesive layer 12 which readily leads to the occurrence of pinholes due to abrasion.

(Organic Polymer Film)

The organic polymer film 13 has fewer defects such as microvoids and has higher insulation properties, as compared to the insulating adhesive layer 12 which is formed by a coating process.

Similar to the insulating adhesive, as the organic polymer film 13, one having a thermal and moisture resistance, or one of which characteristic values required for designing a printed wiring board, such as a dielectric constant, a dielectric loss tangent, or the like, are known, is preferably used.

Examples of the organic polymer film 13 include a polyimide film, a polyamide-imide film, a polyether sulfone film, a polyphenylene sulfone film, a polyethylene terephthalate film, a polyethylene naphthalate film, and a poly(paraphenylene terephthalamide) film, and a poly(paraphenylene terephthalamide) film is particularly desirable for its excellent mechanical properties and satisfactory handling properties even when made into a thin film.

In order to improve handling properties when producing the wiring member 10, the organic polymer film 13 may be supported by a release film, a reinforcing sheet, or the like which is separable, before being adhered to the copper foil 11.

It is preferable that the thickness of the organic polymer film 13 be within the range of 1 to 20 μm. When the thickness of the organic polymer film 13 is 1 μm or more, handling properties and insulation properties will be satisfactory. When the thickness of the organic polymer film 13 is 20 μm or less, electromagnetic coupling between the noise suppressing layer 14 and the copper foil 11 will be strengthened and sufficient noise suppressing effects are achieved. Also, when the thickness of the organic polymer film 13 is 20 μm or less, adhesive strength between the copper foil 11 and the organic polymer film 13 is strengthened since the insulating adhesive layer 12 can be made thick.

The total of the thickness of the organic polymer film 13 and the thickness of the insulating adhesive layer 12 is preferably within the range of 3 to 30 μm. When the total of the thicknesses is 3 μm or more, sufficient insulation between the copper foil 11 and the noise suppressing layer 14 can be maintained, and the short circuit between the copper foil 11 and the noise suppressing layer 14 can be suppressed, as a result of which sufficient noise suppressing effects can be achieved. Also, when the total of the thicknesses is 3 μm or more, the noise suppressing layer 14 is not adversely affected at the time of patterning the copper foil 11 through an etching process. When the total of the thicknesses is 30 μm or less, a printed wiring board provided with the wiring member 10 can be made thin. Also, when the total of the thicknesses is 30 μm or less, electromagnetic coupling between the noise suppressing layer 14 and the copper foil 11 is strengthened because the noise suppressing layer 14 and the copper foil 11 become closer, as a result of which sufficient noise suppressing effects are achieved.

(Noise Suppressing Layer)

The noise suppressing layer 14 is a thin film containing a metallic material or a conductive ceramic, and the thickness thereof is 5 to 200 nm.

When the thickness of the noise suppressing layer 14 is 5 nm or more, sufficient noise suppressing effects can be achieved. On the other hand, when the thickness of the noise suppressing layer 14 is greater than 200 nm, a microcluster as described below grows to form a uniform thin film composed of a metallic material or the like. When such a uniform thin film is formed, the surface resistance decreases, and the metal reflection increases, as a result of which the noise suppressing effects are reduced.

The thickness of the noise suppressing layer 14 is determined by averaging values of the thickness of the noise suppressing layer measured at five points on an image taken by a high resolution transmission electron microscope observing a cross section in the thickness direction of the noise suppressing layer.

Figure 2:
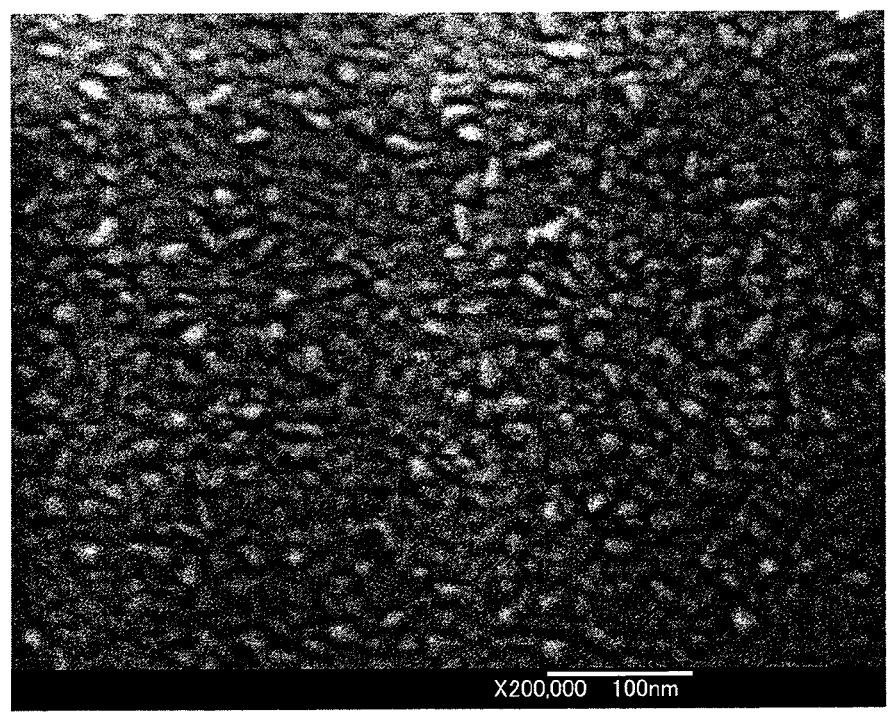
FIG. 2 is an image displayed on a field emission type scanning electron microscope observing the surface of a noise suppressing layer.
Figure 3:
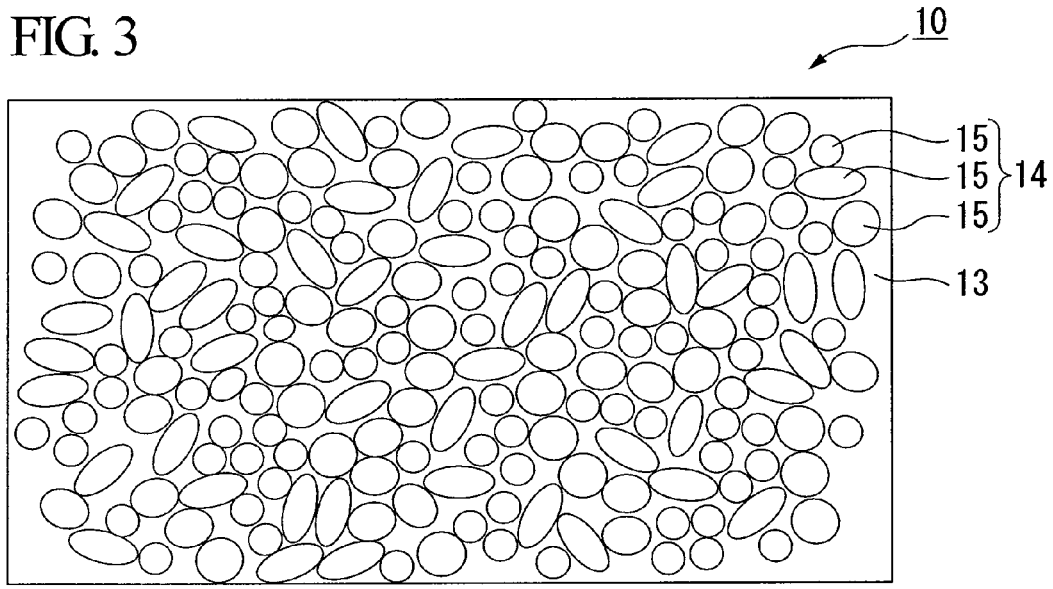
FIG. 3 is a schema of FIG. 2.

FIG. 2 is an image displayed on a field emission type scanning electron microscope observing the surface of a noise suppressing layer, and FIG. 3 is a schematic diagram thereof. The noise suppressing layer 14 is observed as an aggregate of plural microclusters 15. There are physical defects between the microclusters 15, as a result of which a nonuniform thin film is formed.

The formation of a nonuniform thin film with such defects can be identified from the relationship between the volume resistivity $R_1$ ($\Omega \cdot cm$) calculated from the actual measurement value of the surface resistance of the noise suppressing layer 14 and the volume resistivity $R_0$ ($\Omega \cdot cm$) (value disclosed in literature) of the metallic material (or conductive ceramic). That is, excellent noise suppressing effects can be exhibited when the volume resistivity $R_1$ and the volume resistivity $R_0$ satisfy the following formula:

$$0.5 \leq \log R_1 - \log R_0 \leq 3.$$

The surface resistance of the noise suppressing layer 14 is preferably within the range of 50 to 500$\Omega$. The surface resistance of the noise suppressing layer 14 is determined as described below.

Two thin film metal electrodes (with a length of 10 mm, a width of 5 mm, and an inter-electrode distance of 10 mm) are formed by depositing gold or the like onto silica glass, and the resistance between the electrodes is measured with a measuring current of 1 mA or less while pressing an object to be measured with the electrodes at a load of 50 g/(10 mm×20 mm). The measured value is defined as the surface resistance.

Examples of the metallic material include a ferromagnetic metal and a paramagnetic metal. Examples of the ferromagnetic metal include: iron, carbonyl iron; iron alloys such as Fe—Ni, Fe—Co, Fe—Cr, Fe—Si, Fe—Al, Fe—Cr—Si, Fe—Cr—Al, Fe—Al—Si, and Fe—Pt; cobalt, nickel; and alloys thereof. Examples of the paramagnetic metal include gold, silver, copper, tin, lead, tungsten, silicon, aluminum, titanium, chromium, tantalum, molybdenum, alloys thereof, amorphous alloys, and alloys thereof with the ferromagnetic metal. Among these, nickel, iron chromium alloys, tungsten, chromium, tantalum, and noble metals are preferable because they have a resistance to oxidation. Because the noble metals are expensive, nickel, nickel chromium alloys, iron chromium alloys, tungsten, chromium, and tantalum are preferable in terms of practical use, and nickel and nickel alloys are particularly preferable.

Examples of the conductive ceramic include alloys, intermetallic compounds, and solid solutions, composed of a metal and at least one element selected from the group consisting of boron, carbon, nitrogen, silicon, phosphorus, and sulfur. Specific examples thereof include nickel nitride, titanium nitride, tantalum nitride, chromium nitride, titanium carbide, silicon carbide, chromium carbide, vanadium carbide, zirconium carbide, molybdenum carbide, tungsten carbide, chromium boride, molybdenum boride, chromium silicide, and zirconium silicide.

Since the conductive ceramic has a volume resistivity greater than that of a metal, the noise suppressing layer containing the conductive ceramic has some advantages such as the absence of a specific resonance frequency, the wide range of the frequency bringing about the noise suppressing effects, and high storage stability. The conductive ceramic can be easily prepared using a reactive gas containing at least one element selected from the group consisting of nitrogen, carbon, silicon, boron, phosphorus, and sulfur, in accordance with a physical deposition process described below.

(Adhesion Promoting Layer)

In order to enhance the adhesiveness between the copper foil 11 and the insulating adhesive layer 12, an adhesion promoting layer (not illustrated) may be provided between the copper foil 11 and the insulating adhesive layer 12.

The adhesion promoting layer is a layer formed by applying an adhesion promoter on the copper foil 11. Examples of the adhesion promoter include silane coupling agents, and titanate coupling agents.

Examples of the silane coupling agents include vinyl triethoxy silane, vinyl tris(2-methoxyethoxy)silane, 3-methacryloxy propyl trimethoxy silane, 3-glycidoxy propyl trimethoxy silane, 2-(3,4-epoxy cyclohexyl)ethyl trimethoxy silane, N-2-(aminoethyl)3-amino propyl trimethoxy silane, N-2-(aminoethyl)3-aminopropyl methyl dimethoxy silane, 3-aminopropyl triethoxy silane, N-phenyl-3-aminopropyl trimethoxy silane, 3-mercaptopropyl trimethoxy silane, and 3-chloropropyl trimethoxy silane.

Examples of the titanate coupling agents include isopropyl triisostearoyl titanate, isopropyl tris(dioctyl pyrophosphate) titanate, isopropyl tri(N-aminoethyl-aminoethyl) titanate, tetraoctylbis(di-tridecyl phosphate) titanate, bis(dioctyl pyrophosphate) oxyacetate titanate, bis(dioctyl pyrophosphate) ethylene titanate, isopropyl trioctanoyl titanate, isopropyl dimethacryl isostearoyl titanate, isopropyl isostearoyl diacryl titanate, and tetraisopropyl bis(dioctyl phosphate) titanate.

As the adhesion promoter, 3-glycidoxypropyltrimethoxysilane is generally used. In order to enhance the peel strength, between the copper foil 11 and the insulating adhesive layer 12, to 1.0 kgf/cm or more, 3-mercaptopropyltrimethoxysilane is preferably used.

(Method for Producing a Wiring Member According to a First Aspect)

As the methods for producing the wiring member 10 shown in FIG. 1, the following two methods may be exemplified.

(I) A method including a step of forming the noise suppressing layer 14 by physically depositing a metallic material or a conductive ceramic on the organic polymer film 13, followed by a step of adhering the copper foil 11 and the organic polymer film 13 using an insulating adhesive.

In this method, the noise suppressing layer 14 is formed on the organic polymer film 13 in advance, and then the copper foil 11 and the organic polymer film 13 (at the surface opposite to the surface where the noise suppressing layer 14 is formed) are adhered using an insulating adhesive. Accordingly, the penetration of metal ions or the like into the insulating adhesive layer 12 formed after the formation of the noise suppressing layer 14 can be prevented, as a result of which high insulation properties between the noise suppressing layer 14 and the copper foil 11 can be maintained.

(II) A method including a step of adhering the copper foil 11 and the organic polymer film 13 using an insulating adhesive, followed by a step of forming the noise suppressing layer 14 by physically depositing a metallic material or a conductive ceramic on the organic polymer film 13.

As the method (I), the following two methods may be exemplified:

(I-1) a method in which the following steps (a), (b), and (c) are conducted in this order; and (I-2) a method in which the following steps (a), (c), and (b) are conducted in this order.

(a) A step of forming the noise suppressing layer 14 by physically depositing a metallic material or a conductive ceramic on the organic polymer film 13 to achieve the organic polymer film 13 provided with the noise suppressing layer 14.

(b) A step of adhering the copper foil 11 and the organic polymer film 13 using an insulating adhesive to form the insulating adhesive layer 12 between the copper foil 11 and the organic polymer film 13.

(c) A step of removing portions of the noise suppressing layer.

Step (a):

By physically depositing a metallic material or a conductive ceramic as a considerably thin layer on the organic polymer film 13 with few defects such as microcracks, the noise suppressing layer 14 composed of a nonuniform thin film having microclusters can be formed.

A physical deposition process is a method in which a target (a metallic material or a conductive ceramic) is somehow vaporized in a vacuum vessel, and the vaporized metallic material or the like is deposited on a closely placed substrate (organic polymer film 13). The physical deposition process can be further classified into an evaporation deposition process and a sputtering deposition process, depending on the method for vaporizing a target. Examples of the evaporation deposition process include an electron beam (EB) deposition process and an ion plating process. Examples of the sputtering deposition process include a high frequency sputtering process, a magnetron sputtering process, an opposite target type magnetron sputtering process, and an ion implantation process.

In the EB deposition process, evaporated particles have a small energy of 1 eV, and thus causing little damage to the substrate. In addition, although the noise suppressing layer 14 is likely to become porous which tends to make the strength of the noise suppressing layer 14 insufficient, the volume resistivity of the noise suppressing layer 14 increases.

According to the ion plating process, ions of argon gas and evaporated particles are accelerated and collide with the substrate, and thus the particle energy will be larger than that in the EB deposition process and reaching about 1 KeV. As a result, the noise suppressing layer 14 with a strong adhesive force can be obtained. However, the adhesion of micro-sized particles known as droplets cannot be avoided which may result in the termination of discharge.

The magnetron sputtering process is characterized by the achievement of a high deposition rate, due to the generation of strong plasma by the magnetic field, and high particle energy of several tens of electron volts, despite the low utilization efficiency of the target. In the high frequency sputtering process, a target with a low conductivity can be used.

Of all the magnetron sputtering processes, the opposite target type magnetron sputtering process is a method in which a plasma generated between the opposing targets is trapped by the magnetic field and, by placing a substrate beside the opposing targets, a metallic material or the like is deposited on the substrate without receiving plasma damage. For this reason, there are some advantages such as the lack of need to resputter the metallic material or the like deposited on the substrate, the achievement of an even higher deposition rate, and the lack of collision relaxation of the sputtered metal atoms, as a result of which dense microclusters having the same composition as that of the target composition can be formed.

In the physical deposition process, a gas containing at least one element selected from the group consisting of nitrogen, carbon, silicon, boron, phosphorus, and sulfur may be used as a reactive gas.

Step (b):

When producing the wiring member 10 shown in FIG. 1, the copper foil 11 and the organic polymer film 13 are adhered using an insulating adhesive so that the surface of the organic polymer film 13 which is opposite to the surface where the noise suppressing layer 14 is formed (that is, the undeposited surface) contacts the insulating adhesive.

An insulating adhesive is applied, in a solution state, onto the copper foil 11 or the surface of the organic polymer film 13 which is opposite to the surface where the noise suppressing layer 14 is formed. By drying the coating film formed as a result of the application, the insulating adhesive layer 12 is formed in a semihardened state. The insulating adhesive layer 12 may be formed on a mold release film first and then transferred to the copper foil 11 or organic polymer film 13, or may be formed on a mold release film and then used as an independent insulating adhesive sheet by separating from the mold release film.

For the application of an insulating adhesive, a doctor knife coater, a comma coater, a roll coater, a gravure coater, a die coater, or the like is used.

The adhesion of the copper foil 11 and the organic polymer film provided with a noise suppressing layer is conducted by first forming the insulating adhesive layer 12 in a semihardened state on the copper foil 11 or organic polymer film 13 and then superposing the copper foil 11 and organic polymer film 13 via the insulating adhesive layer 12, followed by the application of heat and pressure. The application of heat and pressure is conducted by using a hot roll laminator, a vacuum hot press, or the like.

Figure 4:
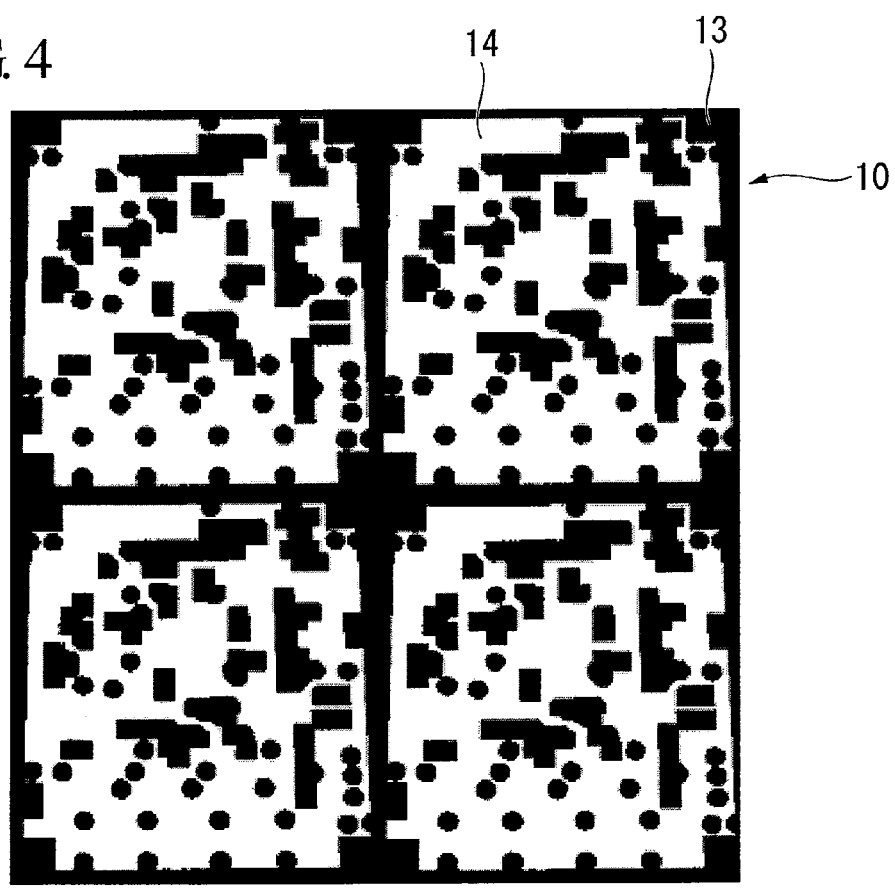
FIG. 4 is a cross sectional view showing one example of the patterned noise suppressing layer.

Step (c):

In the step (c), the noise suppressing layer 14 is patterned to a predetermined shape, for example, as shown in FIG. 4. During this process, an anti pad for those including through holes may be provided. In FIG. 4, the patterned noise suppressing layer 14 is seen as the white area whereas the black area is the organic polymer film 13 exposed at the surface.

The noise suppressing layer 14 can be patterned to a predetermined shape by a general wet process (a wet etching process), dry process (a plasma etching process or a laser ablation process), or the like. Of these processes, a dry process is preferable because no washing or drying step is required and it is also free from contamination problems.

The wavelength of a laser used in the laser ablation process is appropriately selected in accordance with the laser type (carbon dioxide laser, YAG laser, excimer laser, or the like), the properties of the noise suppressing layer 14, or the like. Also, it is important not to supply energy until the laser ablation process and to shift the focus or to weaken the energy in order to avoid causing damage to the organic polymer film 13. A complete insulation between the neighboring microclusters can be achieved by heating the target area instantaneously to melt the surface of the organic polymer film 13, and thereby activating the microclusters in the noise suppressing layer 14 to aggregate. As an apparatus to be used in the laser ablation process, a laser etching apparatus, a convergence/heating type apparatus employing a halogen lamp, or the like can be used.

In addition, as the method (II), a method in which the steps (b), (a), and (c) are conducted in this order may be exemplified.

Step (b):

As described for the method (I) above, an insulating adhesive is applied, in a solution state, onto the copper foil 11 or the organic polymer film 13. By drying the coating film formed as a result of the application, the insulating adhesive layer 12 is formed in a semihardened state. The insulating adhesive layer 12 may be formed on a mold release film first and then transferred to the copper foil 11 or organic polymer film 13, or may be formed on a mold release film and then used as an independent insulating adhesive sheet by separating from the mold release film.

For the application of an insulating adhesive, a doctor knife coater, a comma coater, a roll coater, a gravure coater, a die coater, or the like is used.

The adhesion of the copper foil 11 and organic polymer film 13 is conducted by first forming the insulating adhesive layer 12 in a semihardened state on the copper foil 11 or organic polymer film 13 and then superposing the copper foil 11 and organic polymer film 13 via the insulating adhesive layer 12, followed by the application of heat and pressure. The application of heat and pressure is conducted by using a hot roll laminator, a vacuum hot press, or the like.

Step (a):

As described for the method (I) above, by physically depositing a metallic material or a conductive ceramic as a considerably thin layer on the organic polymer film 13 with few defects such as microcracks, the noise suppressing layer 14 composed of a nonuniform thin film having microclusters can be formed. Methods for conducting a physical deposition process or the like are also the same as those described in the method (I) above, and thus their description is omitted.

Step (c):

As described for the method (I) above, the noise suppressing layer 14 is patterned to a predetermined shape, for example, as shown in FIG. 4.

<A Wiring Member According to a Second Aspect>

Figure 5:
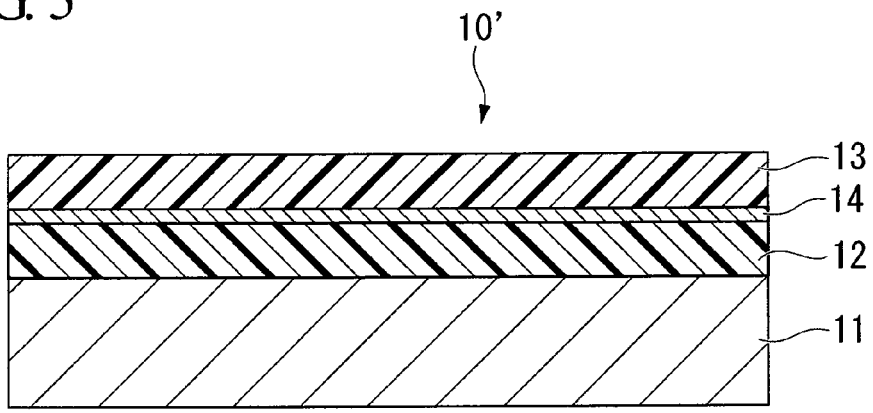
FIG. 5 is a cross sectional view showing a wiring member according to a second aspect of the present invention.

FIG. 5 is a cross sectional view showing a wiring member according to a second aspect of the present invention. The wiring member 10' has a copper foil 11, an organic polymer film 13, a noise suppressing layer 14 formed on the surface of the organic polymer film 13, and an insulating adhesive layer 12 formed between the copper foil 11 and the noise suppressing layer 14. Only the properties of the wiring member different from those described in the aforementioned wiring member according to the first aspect will be described below.

In the wiring member 10' depicted in FIG. 5, the noise suppressing layer 14 is present between the organic polymer film 13 and the copper foil 11, and thus being protected. As a result, the noise suppressing layer 14 is resistant to handling damage or a shearing stress due to the prepreg flow at the time of producing a printed wiring board.

In the wiring member 10' depicted in FIG. 5, it is preferable that the thickness of the insulating adhesive layer 12 be within the range of 1 to 25 μm. When the thickness of the insulating adhesive layer 12 is 1 μm or more, sufficient insulation between the copper foil 11 and the noise suppressing layer 14 can be maintained, and the short circuit between the copper foil 11 and the noise suppressing layer 14 can be suppressed, as a result of which sufficient noise suppressing effects can be achieved. When the thickness of the insulating adhesive layer 12 is 25 μm or less, a printed wiring board provided with the wiring member 10' can be made thin. Also, when the thickness of the insulating adhesive layer 12 is 25 μm or less, electromagnetic coupling between the noise suppressing layer 14 and the copper foil 11 is strengthened because the noise suppressing layer 14 and the copper foil 11 become closer, as a result of which sufficient noise suppressing effects are achieved.

(Method for Producing a Wiring Member According to a Second Aspect)

The wiring member 10' depicted in FIG. 5 can be produced by the following method (I-2'). In the method (I-2'), the steps (a), (c), and (b') are conducted in this order.

In the step (a), as described above in the method for producing the wiring member according to the first aspect, the noise suppressing layer 14 composed of a nonuniform thin film having microclusters can be formed on the organic polymer film 13 by physically depositing a metallic material or a conductive ceramic on the organic polymer film 13.

In the step (c), as described above in the method for producing the wiring member according to the first aspect, the noise suppressing layer 14 is patterned to a predetermined shape by removing portions thereof.

In the step (b'), the copper foil 11 and the noise suppressing layer 14 are adhered using an insulating adhesive, as a result of which the insulating adhesive layer 12 is formed between the copper foil 11 and the noise suppressing layer 14.

As described above, in the method (I-2'), the noise suppressing layer 14, which is formed on the organic polymer film 13 and the portions of which are removed in advance, and the copper foil 11 are adhered using an insulating adhesive. Accordingly, the penetration of metal ions or the like into the insulating adhesive layer 12 formed after the formation of the noise suppressing layer 14 can be prevented, as a result of which high insulation properties between the noise suppressing layer 14 and the copper foil 11 can be maintained.

<Printed Wiring Board>

The wiring member of the present invention is used in a printed wiring board. The copper foil in the wiring member serves as a signal wiring layer, a power supply layer, or a ground layer in the printed wiring board. In order to exhibit sufficient noise suppressing effects, the copper foil in the wiring member preferably serves as a power supply layer or a ground layer, and more preferably a power supply layer. Moreover, in order to achieve sufficient noise suppressing effects, it is preferable that a noise suppressing layer be provided between the power supply layer and the ground layer.

Figure 6:
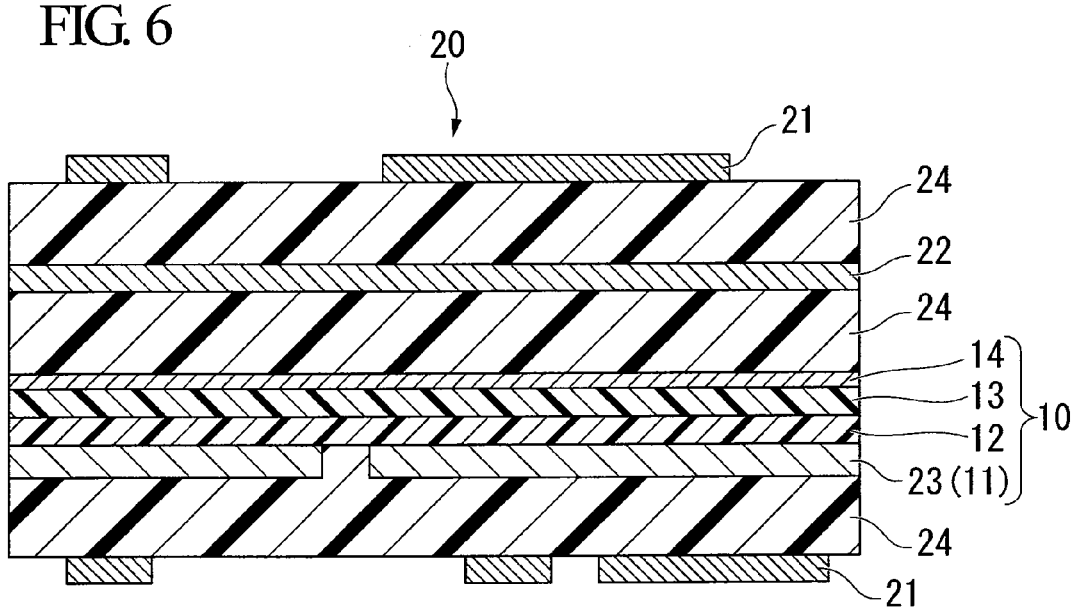
FIG. 6 is a cross sectional view showing one example of a printed wiring board.
Figure 7:
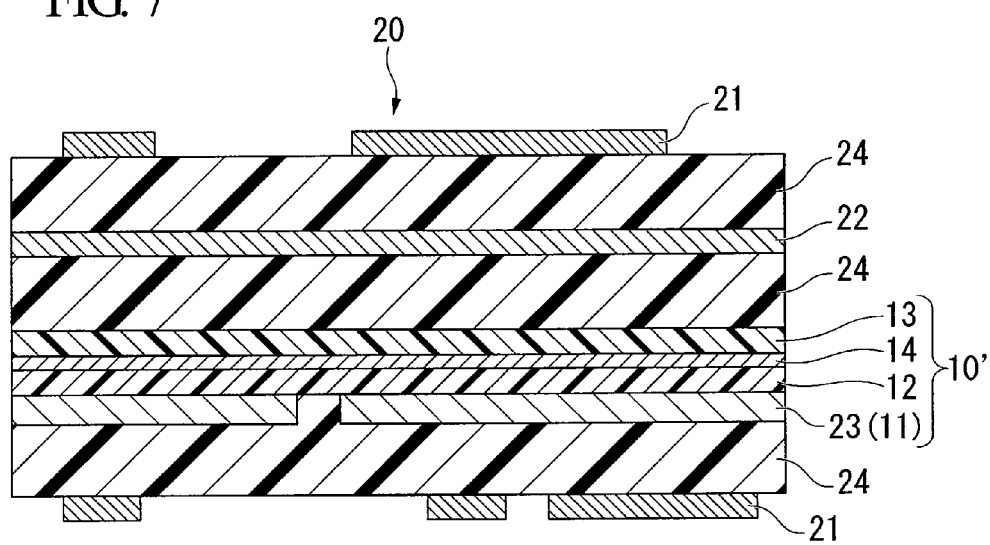
FIG. 7 is a cross sectional view showing another example of a printed wiring board.

FIG. 6 is a cross sectional view showing one example of a printed wiring board using the wiring member 10 depicted in FIG. 1. FIG. 7 is a cross sectional view showing one example of a printed wiring board using the wiring member 10' depicted in FIG. 5. In the printed wiring board 20, a signal wiring layer 21 which is patterned, a ground layer 22 which covers almost the entire surface of the printed wiring board 20, a power supply layer 23, another signal wiring layer 21 which is also patterned are laminated in this order starting from the top via insulating adhesive layers 24. It should be noted that, although not illustrated, the upper and lower signal wiring layers 21 are partially connected via a through hole or the like.

The power supply layer 23 corresponds to the copper foil 11 of the wiring member 10 or 10'.

On the power supply layer 23 in the side where the ground layer 22 is provided in FIG. 6, the noise suppressing layer 14 with almost the same size as that of the ground layer 22 is provided via the insulating adhesive layer 12 and the organic polymer film 13.

On the power supply layer 23 in the side where the ground layer 22 is provided in FIG. 7, the noise suppressing layer 14 with almost the same size as that of the ground layer 22 is provided between the insulating adhesive layer 12 and the organic polymer film 13.

In addition, the power supply layer 23 is divided into two parts, and the divided parts are insulated from each other.

For example, the printed wiring board 20 is produced as described below.

A prepreg prepared by immersing an epoxy resin or the like into a glass fiber or the like is hardened while holding it between the wiring member 10 or 10' and another copper foil to construct the copper foil 11 of the wiring member 10 or 10' as the power supply layer 23, the another copper foil as the ground layer 22, and a layer formed by the prepreg as the insulating adhesive layer 24.

Then, the copper foil 11 of the wiring member 10 or 10' is etched so as to achieve a predetermined shape (two-division pattern) by a photolithography process or the like. During this process, the noise suppressing layer 14 is not damaged by etching since the insulating adhesive layer 12 and the organic polymer film 13 exhibit resistance to an etching solution. Copper foil is adhered to both outermost surfaces of the power supply layer 23 and the ground layer 22 using the prepregs (insulating adhesive layers 24) to form signal wiring layers 21.

Since the wiring member of the present invention as described above includes the copper foil, the noise suppressing layer containing a metallic material or a conductive ceramic with a thickness of 5 to 200 nm, the organic polymer film, and the insulating adhesive layer formed between the copper foil and the noise suppressing layer, an electric potential of a power supply can be stabilized and radiation of unwanted noise can be suppressed by suppressing the resonance between the power supply layer and the ground layer caused by simultaneous switching. The wiring member is a wiring member for a printed wiring board with high internal insulation and of high quality.

In addition, according to the method for producing the wiring member of the present invention, the wiring member can be produced efficiently. Moreover, high insulation properties between the noise suppressing layer 14 and the copper foil 11 can be maintained.

EXAMPLES (Thickness of Noise Suppressing Layer)

The thickness of a noise suppressing layer was measured at five points by observing a cross section of the noise suppressing layer using a transmission electron microscope manufactured by Hitachi, Ltd., under the trade name of H9000NAR and the measured values were averaged.

(Surface Resistance)

Two thin film metal electrodes (with a length of 10 mm, a width of 5 mm, and an inter-electrode distance of 10 mm) were formed by depositing gold or the like onto silica glass, and the resistance between the electrodes was measured with a measuring current of 1 mA or less while pressing an object to be measured with the electrodes at a load of 50 g/(10 mm×20 mm), and the measured value was defined as the surface resistance.

(Insulation Properties)

Insulation properties were evaluated by applying a measuring voltage at 50V and measuring the resistance between copper foil and a noise suppressing layer using a super insulation meter manufactured by DKK-TOA CORPORATION under the trade name of SM-8210.

(Noise Suppressing Effects)

A two-layered board composed of a ground layer and a power supply layer was prepared. At both ends of the power supply layer, SMA connectors linking to the power supply layer and the ground layer are mounted. S21 (transmission attenuation amount, unit: dB) was measured in accordance with the S-parameter method using a network analyzer (manufactured by Anritsu Corporation under the trade name of 37247D) connected to the SMA connectors, and the resonance state of the S21 parameters was checked. When the noise suppressing effects were exhibited, the attenuation amount in the resonance frequency increases, and the graph indicating the relationship between the attenuation amount and frequency becomes smooth.

Example 1

A noise suppressing layer with a thickness of 15 nm was formed on the entirety of one surface of a poly(paraphenylene terephthalamide) film with a thickness of 4 μm (manufactured by Teijin Advanced Films Ltd., under the trademark of ARAMICA) by depositing a chromium metal through an EB deposition process, thereby obtaining a film attached with a noise suppressing layer. When the surface of the noise suppressing layer was observed using a high resolution transmission electron microscope, formation of a nonuniform thin film as shown in FIG. 2 was confirmed. The surface resistance of the noise suppressing layer was 89 Ω.

43.5 parts by mass of bisphenol A type epoxy resin (manufactured by Japan Epoxy Resins Co., Ltd., under the trade name of 1001) and 35.5 parts by mass of carboxy-terminated butadiene nitrile rubber (manufactured by Zeon Corporation, under the trademark of NIPOL 1072) were dissolved in methyl ethyl ketone. Then, 0.2 parts by mass of imidazole-based hardening accelerator (manufactured by Shikoku Chemicals Corporation, under the trademark of CUREZOL 2E4MZ) were added to the solution to prepare a varnish containing 8% by mass of a resin composition.

An electrolytic copper foil having one surface with a surface roughness Rz of 3.4 μm (smooth surface), and having a thickness of 18 μm, a width of 500 mm, and a length of 500 mm was prepared. The varnish was applied on the smooth surface of the electrolytic copper foil using a roll coater and then dried, thereby forming an insulating adhesive layer having a thickness of 7 μm in a semihardened state.

The copper foil and the poly(paraphenylene terephthalamide) film attached with a noise suppressing layer were adhered via the insulating adhesive layer so that the undeposited surface of the poly(paraphenylene terephthalamide) film attached with a noise suppressing layer contacted the insulating adhesive layer. The resultant was laminated with a hot roll laminator heated at 180° C., and was then introduced to a hot air oven at 150° C. for 1 hour, thereby hardening the insulating adhesive. Due to the above procedures, a wiring member with a thickness of 29 μm was obtained, in which the poly(paraphenylene terephthalamide) film was sandwiched between the copper foil and the noise suppressing layer and the insulating adhesive layer was sandwiched between the copper foil and the poly(paraphenylene terephthalamide) film.

Subsequently, the obtained wiring member was cut so as to achieve the dimensions of 74 mm×160 mm, and portions of the noise suppressing layer were removed to be patterned into the same shape as that shown in FIG. 4 using a laser etching apparatus.

The insulation properties in terms of the resistance between the copper foil and the noise suppressing layer were $6\times10^{12} \Omega$.

Figure 8:
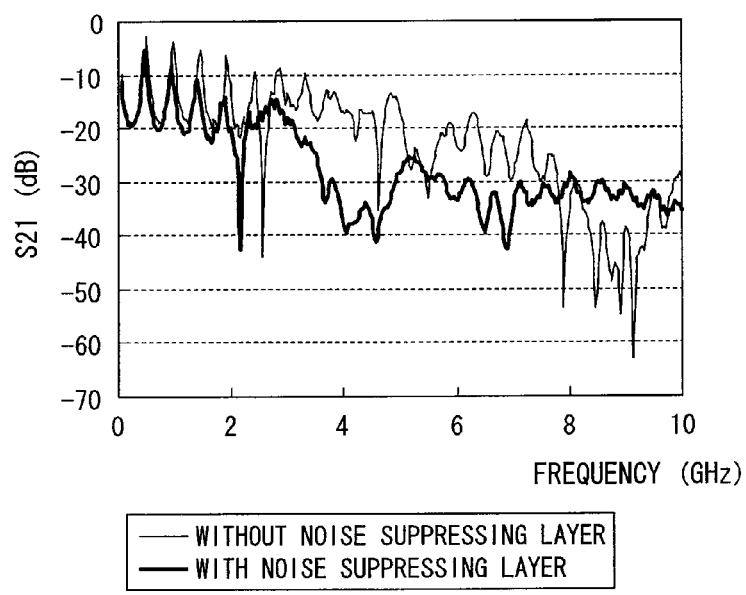
FIG. 8 is a graph indicating S21 (transmission attenuation amount) of printed wiring boards of Example 1 and Comparative Example 1.

The obtained wiring member was integrated with the copper foil with a thickness of 18 μm via the prepreg with a thickness of 0.2 mm to prepare a two-layered board. The copper foil of the wiring member was etched so as to achieve the dimensions of 68 mm×160 mm. S21 of the board was measured in accordance with the S-parameter method. The results are shown in FIG. 8.

Example 2

A polyamide-imide film with a thickness of 6 μm was formed by applying a polyamide-imide solution (manufactured by Toyobo Co., Ltd., under the trademark of VYLO-MAX HR13NX) on a polyethylene naphthalate film subjected to a release treatment and having a thickness of 50 μm, followed by drying, thereby obtaining a laminated sheet with a thickness of 56 μm. A tantalum metal was deposited on the polyamide-imide film by a reactive sputtering process while inpouring nitrogen gas therein to form a noise suppressing layer with a thickness of 20 nm and dimensions of 160 mm×160 mm, thereby obtaining a laminated sheet attached with a noise suppressing layer. The surface resistance of the noise suppressing layer was 152 Ω.

Subsequently, portions of the noise suppressing layer were removed to be patterned into the same shape as that shown in FIG. 4 using a laser etching apparatus.

An electrolytic copper foil having one surface with a surface roughness Rz of 5.3 μm (smooth surface), and having a thickness of 12 μm, a width of 74 mm, and a length of 160 mm was prepared.

The copper foil and the laminated sheet attached with a noise suppressing layer were adhered via epoxy prepreg (insulating adhesive) with a thickness of 24 μm so that the deposited surface of the laminated sheet attached with a noise suppressing layer (that is, the noise suppressing layer) contacted the epoxy prepreg, and a temporary bonding process was conducted at 150° C. for 2 minutes using a vacuum press. Then the polyethylene naphthalate film was separated, and the resultant was again subjected to vacuum pressing at 130 to 170° C. (with a temperature increase rate of 1.2° C./min). Due to the above procedures, a wiring member with a thickness of 48 μm was obtained, in which the noise suppressing layer was sandwiched between the polyamide-imide film and the copper foil and the insulating adhesive layer was sandwiched between the copper foil and the noise suppressing layer.

The insulation properties in terms of the resistance between the copper foil and the noise suppressing layer were $8 \times 10^{13} \Omega$.

Figure 9:
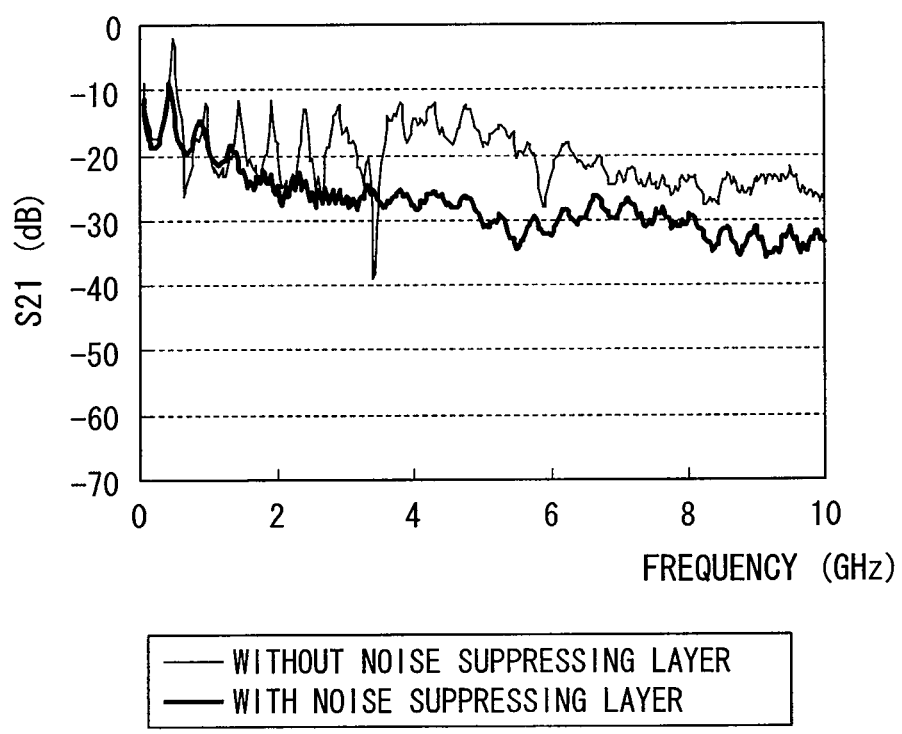
FIG. 9 is a graph indicating S21 (transmission attenuation amount) of printed wiring boards of Example 2 and Comparative Example 2.

The obtained wiring member was used to prepare a two-layered board in the same manner as that of Example 1. The size of the two-layered board was adjusted to achieve the dimensions of 74 mm×160 mm, and the copper foil of the wiring member was etched so as to achieve the dimensions of 56 mm×160 mm. S21 of the board was measured in accordance with the S-parameter method. The results are shown in FIG. 9.

Comparative Examples 1 and 2

A wiring member was prepared in the same manner as that of Examples 1 and 2, except that no noise suppressing layer was formed. The obtained wiring member was used to prepare a two-layered board in the same manner as that of Examples 1 and 2, and S21 of the board was measured in accordance with the S-parameter method. The results are shown in FIGS. 8 and 9.

Comparative Example 3

A wiring member with a thickness of 29 μm was prepared in the same manner as that of Example 1, except that a poly(paraphenylene terephthalamide) film with a thickness of 4 μm was not used, the thickness of the insulating adhesive layer was 11 μm, and the noise suppressing layer was formed on the insulating adhesive layer. When the insulation properties in terms of the resistance between the copper foil and the noise suppressing layer were examined, the conduction therebetween was observed.

Example 3

43.5 parts by mass of bisphenol A type epoxy resin (manufactured by Japan Epoxy Resins Co., Ltd., under the trade name of 1001) and 35.5 parts by mass of carboxy-terminated butadiene nitrile rubber (manufactured by Zeon Corporation, under the trademark of NIPOL 1072) were dissolved in methyl ethyl ketone. Then, 0.2 parts by mass of imidazole-based hardening accelerator (manufactured by Shikoku Chemicals Corporation, under the trademark of CUREZOL 2E4MZ) were added to the solution to prepare a varnish containing 8% by mass of a resin composition.

An electrolytic copper foil having one surface with a surface roughness Rz of 3.4 μm (smooth surface), and having a thickness of 18 μm, a width of 500 mm, and a length of 500 mm was prepared. The varnish was applied on the smooth surface of the electrolytic copper foil using a roll coater and then dried, thereby forming an insulating adhesive layer having a thickness of 7 μm in a semihardened state.

The copper foil and the poly(paraphenylene terephthalamide) film with a thickness of 4 μm (manufactured by Teijin Advanced Films Ltd., under the trademark of ARAMICA) were adhered via the insulating adhesive layer. The resultant was laminated with a hot roll laminator heated at 180° C., and was then introduced to a hot air oven at 150° C. for 1 hour, thereby hardening the insulating adhesive. Due to the above procedures, a copper foil attached with a film and having a thickness of 29 μm was obtained, in which the insulating adhesive layer was sandwiched between the copper foil and the poly(paraphenylene terephthalamide) film.

A noise suppressing layer with a thickness of 15 nm was formed on the poly(paraphenylene terephthalamide) film attached to the copper foil by depositing a chromium metal through an EB deposition process, thereby obtaining a wiring member. When the surface of the noise suppressing layer was observed using a high resolution transmission electron microscope, formation of a nonuniform thin film as shown in FIG. 2 was confirmed. The surface resistance of the noise suppressing layer was 89 Ω.

Subsequently, the obtained wiring member was cut so as to achieve the dimensions of 74 mm×160 mm, and portions of the noise suppressing layer were removed to be patterned into the same shape as that shown in FIG. 4 using a laser etching apparatus.

The insulation properties in terms of the resistance between the copper foil and the noise suppressing layer were $6 \times 10^{12} \Omega$.

The obtained wiring member was integrated with the copper foil with a thickness of 18 μm via the prepreg with a thickness of 0.2 mm to prepare a two-layered board. The copper foil of the wiring member was etched so as to achieve the dimensions of 68 mm×160 mm. S21 of the board was measured in accordance with the S-parameter method, as a result of which the same result as that of Example 1 was obtained.

Example 4

A solution containing 1% by mass of 3-glycidoxypropyltrimethoxysilane was applied, using a spray coater, on the surface of an electrolytic copper foil with a thickness of 35 μm and having a surface roughness Rz of 0.4 μm, followed by drying at 100° C., thereby forming an adhesion promoting layer.

30 parts by mass of bisphenol A type epoxy resin (manufactured by Japan Epoxy Resins Co., Ltd., under the trade name of 828), 30 parts by mass of brominated bisphenol A type resin (manufactured by Tohto Kasei Co., Ltd., under the trade name of YDB-500), and 35 parts by mass of cresol novolak resin (manufactured by Tohto Kasei Co., Ltd., under the trade name of YDCN-704) were dissolved in methyl ethyl ketone. Then, 0.2 parts by mass of imidazole-based hardening accelerator (manufactured by Shikoku Chemicals Corporation, under the trademark of CUREZOL 2E4MZ) were added to the solution to prepare a varnish containing 8% by mass of the resin composition.

The varnish was applied on the adhesion promoting layer using a roll coater so that a coating film with a thickness of 6 μm was formed after being dried. After the coating film was dried in air for 20 minutes, the coating film was semihardened by heating it at 160° C. for 5 minutes, thereby obtaining a copper foil with dimensions of 300 mm×300 mm in which the insulating adhesive layer was formed.

The copper foil with a formed insulating adhesive layer and a polyimide film with a thickness of 12 μm (Kapton H type manufactured by Du Pont-Toray Co., Ltd.) were laminated with a hot roll laminator heated at 170° C. so that the insulating adhesive layer contacted the polyimide film, followed by a post curing process at 150° C. for 30 minutes, thereby obtaining a copper foil attached with a film and having a thickness of 53 μm.

A nickel metal was deposited on the polyimide film attached to the copper foil by a reactive sputtering process while inpouring nitrogen gas therein to form a noise suppressing layer, thereby obtaining a wiring member. The surface resistance of the noise suppressing layer was 58 Ω.

Subsequently, 20 circular patterns with a diameter of 3 mm were formed on the noise suppressing layer by removing the portions thereof using a laser etching apparatus for a possible anti pad for through holes.

The insulation properties in terms of the resistance between the copper foil and the noise suppressing layer were $4 \times 10^{12} \Omega$.

Comparative Example 4

A wiring member was prepared in the same manner as that of Example 3, except that no noise suppressing layer was formed. The obtained wiring member was used to prepare a two-layered board in the same manner as that of Example 3, and S21 of the board was measured in accordance with the S-parameter method, as a result of which the same result as that of Comparative Example 1 was obtained.

Comparative Example 5

A wiring member with a thickness of 53 μm was prepared in the same manner as that of Example 4, except that a polyimide film with a thickness of 12 μm was not used, the thickness of the insulating adhesive layer was 18 μm, and the noise suppressing layer was formed on the insulating adhesive layer. When the insulation properties in terms of the resistance between the copper foil and the noise suppressing layer were examined, the conduction therebetween was observed.

INDUSTRIAL APPLICABILITY

The wiring member of the present invention is useful as a member which can constitute a printed wiring board that supplies power and transmits signals to semiconductor elements, electronic parts, or the like, such as ICs and LSIs. Moreover, according to the production method of the present invention, such wiring members can be produced.

What is claimed is:

1. A wiring member comprising:
a copper foil;
a noise suppressing layer comprising a metallic material or a conductive ceramic and having a thickness within the range of 5 to 200 nm;
an organic polymer film provided between the copper foil and the noise suppressing layer; and
an insulating adhesive layer provided between the copper foil and the organic polymer film.

2. The wiring member according to claim 1, wherein a total thickness of the organic polymer film and the insulating adhesive layer is within the range of 3 to 30 μm.

3. The wiring member according to claim 1, wherein the noise suppressing layer has a pattern, in which the layer is partially removed.

4. A wiring member comprising:
a copper foil;
an organic polymer film;
a noise suppressing layer provided between the copper foil and the organic polymer film, the noise suppressing layer including a metallic material or a conductive ceramic and having a thickness within the range of 5 to 200 nm; and
an insulating adhesive layer provided between the copper foil and the noise suppressing layer.

5. The wiring member according to claim 4, wherein a thickness of the insulating adhesive layer is within the range of 1 to 25 μm.

6. The wiring member according to claim 4, wherein the noise suppressing layer has a pattern, in which portions of the noise suppressing layer are removed.

7. The wiring member according to claim 1, wherein a thickness of the organic polymer film is within the range of 1 to 20 μm.

8. A method for producing the wiring member of claim 3, the method comprising the following steps (a), (b), and (c):
(a) a step of forming a noise suppressing layer by physically depositing a metallic material or a conductive ceramic on an organic polymer film;
(b) a step of adhering a copper foil and the organic polymer film using an insulating adhesive; and
(c) a step of removing portions of the noise suppressing layer.

9. The method according to claim 8, wherein the steps (a), (b), and (c) are conducted in this order.

10. The method according to claim 8, wherein the steps (a), (c), and (b) are conducted in this order.

11. The method according to claim 8, wherein the steps (b), (a), and (c) are conducted in this order.

12. A method for producing the wiring member of claim 6, the method comprising the following steps (a), (c), and (b'):
(a) a step of forming a noise suppressing layer by physically depositing a metallic material or a conductive ceramic on an organic polymer film;
(c) a step of removing portions of the noise suppressing layer; and
(b') a step of adhering a copper foil and the noise suppressing layer using an insulating adhesive,
wherein the steps (a), (c), and (b') are conducted in this order.

* * * * *